US011984399B2

(12) United States Patent
Liu

(10) Patent No.: US 11,984,399 B2
(45) Date of Patent: May 14, 2024

(54) SEMICONDUCTOR STRUCTURE AND MASK PLATE STRUCTURE

(71) Applicant: CHANGXIN MEMORY TECHNOLOGIES, INC., Hefei (CN)

(72) Inventor: Xiang Liu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 132 days.

(21) Appl. No.: 17/661,334

(22) Filed: Apr. 29, 2022

(65) Prior Publication Data
US 2023/0053461 A1    Feb. 23, 2023

(30) Foreign Application Priority Data

Aug. 20, 2021   (CN) .......................... 202110961840.4

(51) Int. Cl.
*H01L 23/528*    (2006.01)
*H01L 27/108*    (2006.01)
*H10B 12/00*    (2023.01)

(52) U.S. Cl.
CPC ........... *H01L 23/528* (2013.01); *H10B 12/00* (2023.02)

(58) Field of Classification Search
CPC ............................. H01L 23/528; H10B 12/00
See application file for complete search history.

(56) References Cited

U.S. PATENT DOCUMENTS

| 10,169,521 | B2* | 1/2019 | Wang | .................... G06F 30/394 |
| 10,354,876 | B1* | 7/2019 | Chang | ................. H01L 21/0337 |
| 2019/0051654 | A1* | 2/2019 | Chang | ................ H10B 12/0335 |
| 2022/0406791 | A1* | 12/2022 | Kim | ....................... H10B 12/34 |
| 2023/0053461 | A1* | 2/2023 | Liu | ........................ H01L 23/528 |

FOREIGN PATENT DOCUMENTS

| CN | 108573079 B | 11/2019 |
| CN | 110534525 A | 12/2019 |

* cited by examiner

*Primary Examiner* — Mary A Wilczewski
*Assistant Examiner* — Jaesun Lee
(74) *Attorney, Agent, or Firm* — Cooper Legal Group, LLC

(57) ABSTRACT

Embodiments of the present application relate to the field of semiconductor manufacturing technologies, in particular to a semiconductor structure and a mask plate structure. The semiconductor structure includes a substrate, where the substrate is provided therein with active areas and a plurality of bit line structures arranged at intervals in parallel in the substrate. A plurality of word line structures are arranged at intervals in parallel in the substrate. The word line structures and the bit line structures intersect to define a plurality of grids arranged in an array on the substrate. Capacitor plugs are located in the grids. Projection of each of the capacitor plugs on the substrate covers a part of one of the active areas. Cross sections of the capacitor plugs are arcuate in a cross section parallel to a surface of the substrate.

5 Claims, 5 Drawing Sheets

SEMICONDUCTOR STRUCTURE AND MASK PLATE STRUCTURE

CROSS-REFERENCE TO RELATED APPLICATIONS

This application claims the priority of Chinese Patent Application No. 202110961840.4, submitted to the Chinese Intellectual Property Office on Aug. 20, 2021, the disclosure of which is incorporated herein in its entirety by reference.

TECHNICAL FIELD

Embodiments of the present application relate to the field of semiconductor manufacturing technologies, in particular to a semiconductor structure and a mask plate structure.

BACKGROUND

With gradual development of storage device technologies, a dynamic random access memory (DRAM) is widely used in various electronic devices due to its high density and fast reading/writing speed. The DRAM includes many repeated memory cells. Each memory cell usually includes a capacitor structure and a transistor structure. A gate of the transistor structure is connected to a word line. One terminal of the transistor structure is connected to a bit line, and the other terminal of the transistor structure is connected to the capacitor structure.

In the related art, the transistor structure is arranged in the substrate. The capacitor structure is connected to one terminal of the transistor structure by using a capacitor plug, such that data information in the capacitor structure is read and written by turning on/off the transistor structure. Projection of the capacitor plug on the substrate is usually rectangular. However, as the integration level of the integrated circuit becomes increasingly high, the size of the capacitor plug is accordingly reduced, which reduces the contact area between the capacitor plug and the active area, and affects the performance of the semiconductor structure.

SUMMARY

According to a first aspect of some embodiments of the present application, a semiconductor structure is provided and includes:
- a substrate, where the substrate is provided therein with active areas and word line structures, and a plurality of word line structures are arranged at intervals in parallel in the substrate;
- bit line structures, where a plurality of bit line structures are arranged at intervals in parallel on the substrate, and the word line structures and the bit line structures intersect to define a plurality of grids arranged in an array on the substrate; and
- capacitor plugs, located in the grids, where projection of each of the capacitor plugs on the substrate covers a part of one of the active areas, and cross sections of the capacitor plugs are arcuate in a cross section parallel to a surface of the substrate.

According to a second aspect of some embodiments of the present application, a mask plate structure is also provided and includes a mask component; where a mask pattern is provided on the mask component, and the mask component is used to cover a semiconductor structure, such that capacitor plugs are formed on the semiconductor structure by using the mask component;

the semiconductor structure includes a substrate, a plurality of bit line structures arranged at intervals in parallel in the substrate, and a plurality of word line structures arranged at intervals in parallel on the substrate; the substrate is internally provided active areas; the word line structures and the bit line structures intersect to define a plurality of grids arranged in an array on the substrate;

the capacitor plugs are located in the grids, projection of each of the capacitor plugs on the substrate covers a part of one of the active areas, and cross sections of the capacitor plugs are arcuate in a cross section parallel to a surface of the substrate.

BRIEF DESCRIPTION OF THE DRAWINGS

To describe the technical solutions in the embodiments of the present application or in the related art more clearly, the following briefly describes the accompanying drawings required for describing the embodiments or the related art. Apparently, the accompanying drawings in the following description show some embodiments of the present application, and a person of ordinary skill in the art may still derive other accompanying drawings from these accompanying drawings without creative efforts.

DETAILED DESCRIPTION

To clearly understand the technical solutions of the present application, the related technical solutions are described first in detail.

A DRAM includes many repeated memory cells. Each memory cell usually includes a capacitor structure and a transistor structure, and the capacitor structure and the transistor structure are connected. By using the transistor structure, data stored in the capacitor structure is read and stored or data is written into the capacitor structure. A gate of the transistor structure is connected to a word line. One end of the transistor structure is connected to a bit line, and the other end of the transistor structure is connected to the capacitor structure.

In the related art, the transistor structure is arranged in the substrate and is connected to one end of the capacitor structure, such that data information in the capacitor structure is read and written by switching on/off the transistor structure. Projection of the capacitor plug on the substrate is usually rectangular. With the development of technology, because the requirements for memory integration become increasingly high, the size of the capacitor plug is decreased. As a result, the contact area between the capacitor plug and the active area is decreased, affecting the performance of the semiconductor structure.

In view of this, embodiments of the present application provide a semiconductor structure and a mask plate structure. Projection of capacitor plugs on a substrate covers parts of active areas. Cross sections of the capacitor plugs are arcuate in a cross section parallel to a surface of the substrate. When there is a distance between each of the capacitor plugs and each of the bit line structures, compared with a capacitor plug with a rectangular cross section, the contact area between the capacitor plug with an arcuate cross section and the active area is increased, which is beneficial to improving the performance of the semiconductor structure.

Some embodiments of the present application are described below with reference to the accompanying drawings. Those skilled in the art should understand that the following implementations are only illustrative, not exhaustive enumeration. On the basis of these implementations, those skilled in the art can replace, concatenate or combine some features or some examples, which should still be regarded as the disclosure content of the present application.

For example, the semiconductor structure in this embodiment may be a DRAM. Certainly, this embodiment is not limited thereto, and the semiconductor structure in this embodiment may also be other structures.

Figure 1:
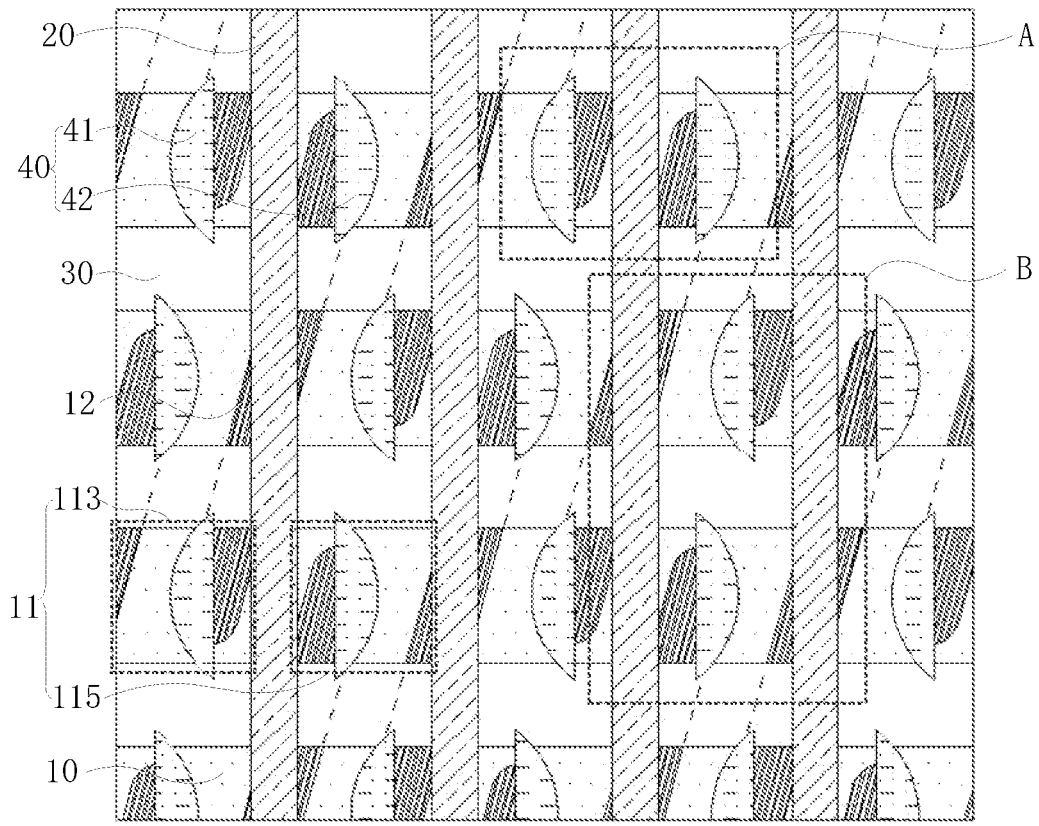
FIG. 1 is a top view of a semiconductor structure according to an embodiment of the present application.

As shown in FIG. 1 (the dotted line in FIG. 1 is the projection of the active area covered by the word line structure), the semiconductor structure provided by this embodiment includes a substrate 10, word line structures 30, bit line structures 20 and capacitor plugs 40.

A material of the substrate 10 may be, for example, monocrystalline silicon, polycrystalline silicon, amorphous silicon, silicon-germanium compound, silicon-on-insulator, and other materials known to those skilled in the art. The substrate 10 is provided therein with active areas and word line structures 30. The active areas are arranged in an array. Isolation structures may be also arranged in the substrate 10, and the isolation structures are located in the peripheries of the active areas and are used to isolate adjacent active areas. The active area may be made of silicon. The isolation structure may be made of silicon oxide.

The plurality of word line structures 30 are arranged at intervals in parallel in the substrate 10. In this embodiment, the word line structures 30 may be buried word lines. The buried word lines intersect with the active areas and extend along a surface parallel to the substrate 10. The buried word lines may include a word line conductive layer and a gate electrode layer. The gate electrode layer is located in a region where the buried word line intersects with the active area, and the word line conductive layer is located in other regions of the buried word lines.

A plurality of bit line structures 20 are arranged at intervals in parallel on the substrate 10. Projection of the word line structures 30 intersect with that of the bit line structures 20 on the substrate. The word line structures and the bit line structures define a plurality of grids 11 arranged in an array on the substrate 10. In this embodiment, for example, the extension direction of the bit line structures 20 is perpendicular to that of the word line structures 30, that is, the plurality of grids 11 defined by the word line structures 30 and the bit line structures 20 are rectangular.

The capacitor plug 40 is located in the grid 11. The projection of the capacitor plug 40 on the substrate 10 covers a part of the active area. The capacitor plug 40 extends in a direction perpendicular to the surface of the substrate 10 until the capacitor plug 40 is connected to the active area, such that the capacitor structure is connected to the active area by using the capacitor plug 40, and data information in the capacitor structure is stored or read. The cross section of the capacitor plug 40 is arcuate in a cross section parallel to the surface of the substrate 10, to increase a distance between the capacitor plug 40 and the adjacent bit line structure 20, and reduce the parasitic capacitance generated between them, thereby preventing current leakage from occurring.

In the semiconductor structure provided by this embodiment, the substrate 10 is provided therein with active areas. A plurality of bit line structures 20 are arranged at intervals in parallel on the substrate 10. A plurality of word line structures 30 are arranged at intervals in parallel on the substrate 10. The word line structures 30 and the bit line structures 20 intersect to define a plurality of grids 11 arranged in an array on the substrate 10. The capacitor plug 40 is located in the grid 11. Projection of the capacitor plug 40 on the substrate 10 covers a part of the active area. A cross section of the capacitor plug 40 is arcuate in a cross section parallel to a surface of the substrate 10. When a distance between capacitor plugs 40 is the same as that between bit line structures 20, compared with a capacitor plug 40 with a rectangular cross section, the contact area between a capacitor plug 40 with an arcuate cross section and the active area is increased, which is beneficial to improving the performance of the semiconductor structure.

Figure 2:
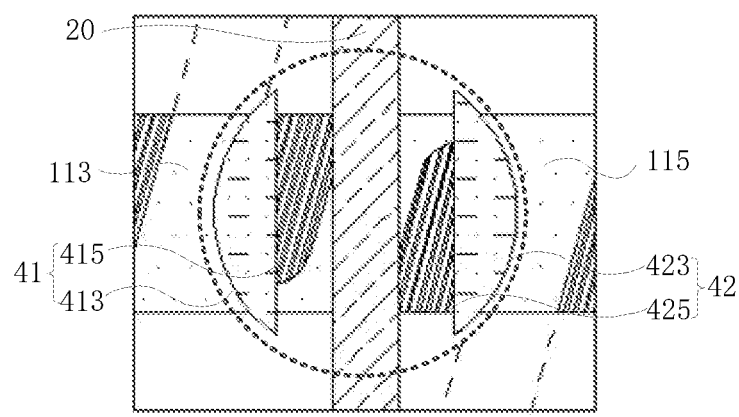
FIG. 2 is a partial enlarged view of the semiconductor structure in a position A according to an embodiment of the present application.

With reference to FIG. 1 and FIG. 2, the grid 11 includes a first grid 113 located at one side of the bit line structure 20 and a second grid 115 located at the other side of the bit line structure 20. The capacitor plug 40 includes a first plug 41 located in the first grid 113 and the second plug 42 located in the second grid 115. In the cross section parallel to the surface of the substrate 10, the cross section of the first plug 41 has a first arc 413, and the cross section of the second plug 42 has a second arc 423. The first arc 413 and the second arc 423 are located in a same circle.

As shown in FIG. 1 and FIG. 2, the first grid 113 and the second grid 115 are arranged in an array. Specifically, the first grid 113 and the second grid 115 are arranged alternately in an extension direction parallel to the bit line structure 20 and a direction parallel to the surface of the substrate 10. The first grid 113 and the second grid 115 are still arranged alternately in an extension direction perpendicular to the bit line structure 20 and a direction parallel to the surface of the substrate 10. The first plug 41 is located in the first grid 113, and the second plug 42 is located in a second grid 115, such that the first plug 41 and the second plug 42 are arranged alternately in the foregoing two directions. The cross section of the first plug 41 has a first arc 413 and a first secant 415 connected to the first arc 413. The cross section of the second plug 42 has a second arc 423 and a second secant 425 connected to the second arc 423.

With reference to FIG. 2, if a distance between the arc of the first plug 41 and a bit line structure 20 is smaller than that between the secant of the first plug 41 and the same bit line structure 20, the distance between the secant of the second plug 42 and the bit line structure 20 is smaller than the arc of the second plug 42 and the bit line structure 20. The circle centers of the first arc 413 and the second arc 423 overlap, that is, the first arc 413 and the second arc 423 are located in a same circle.

In some embodiments, the circle centers of the first arc 413 and the second arc 423 are located on the center line of the bit line structure 20. For example, the distance between the first arc 413 and a center line of the bit line structure 20 is the same as that between the second arc 423 and the center line of the bit line structure 20, that is, a distance between the first arc 413 and its adjacent bit line structure 20 is equal to that between the second arc 423 and its adjacent bit line structure 20. When the size of the capacitor plug 40 is further decreased, the positions of circle centers of the first arc 413 and the second arc 423 are not changed, which is beneficial to further increase a distance between the capacitor plug 40 and its adjacent bit line structure 20, thereby preventing current leakage from occurring.

Figure 3:
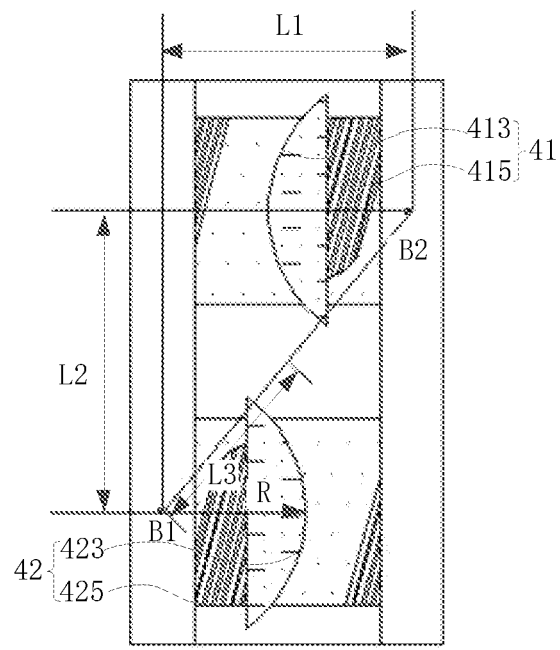
FIG. 3 is a partial enlarged view of the semiconductor structure in a position B according to an embodiment of the present application.

With reference to FIG. 1 and FIG. 3, optionally, there is a first distance L1 between center lines of any two adjacent bit line structures 20 along a direction parallel to the surface of the substrate 10. There is a second distance L2 between center lines of any two adjacent word line structures 30 along a direction parallel to the surface of the substrate 10.

It needs to be noted that the projection of the capacitor plug 40 on the substrate 10 can cover a part of the active area. The capacitor plug 40 of which its projection can cover a part of the active area is an efficient region, while the capacitor plug 40 of which its projection cannot cover the active area is not an efficient region. For example, radiuses R of the first arc 413 and the second arc 423 are greater than half the first distance L1, such that the capacitor plug 40 has a sufficient efficient region, to ensure that the capacitor plug 40 can be connected to the active area, which is beneficial to connect the capacitor structure to the active area by using the capacitor plug 40. The radiuses R of the first arc 413 and the second arc 423 are less than half a positive square root of a sum of squares of the first distance L1 and the second distance L2. As shown in FIG. 3, a distance between a circle center B1 on one side of the word line structure 30 and a circle center B2 on the other side of the word line structure 30 is the positive square root of the sum of squares of the first distance L1 and the second distance L2. Half the positive square root of the sum of squares of the first distance L1 and the second distance L2 is a distance L3. The radiuses R of the first arc 413 and the second arc 423 are less than the distance L3, to prevent the capacitor plugs 40 located on two sides of the word line structure 30 from overlapping due to the excessively large radiuses R. In some embodiments, the cross section of the first plug 41 has a first secant 415. The cross section of the second plug 42 has a second secant 425. The first secant 415 and the second secant 425 are parallel to the extension direction of the bit line structure 20. For example, the first secant 415 and the second secant 425 are located on two sides of the bit line structure 20. The first secant 415 and the second secant 425 are parallel to the extension direction of the bit line structure 20. In some embodiments, the projection of the first secant 415 and that of the second secant 425 on the substrate 10 cover a part of the word line structure 30, such that the capacitor plug 40 has a sufficient efficient region, to ensure that the capacitor plug 40 can be connected to the active area, which is beneficial to connect the capacitor structure to the active area by using the capacitor plug 40.

An embodiment of the present application further provides a mask plate structure, including a mask component. A mask pattern is provided on the mask component, and the mask component is used to cover a semiconductor structure, such that capacitor plugs are formed on the semiconductor structure by using the mask component. In one embodiment, the mask component may cover the semiconductor structure. The semiconductor structure directly opposite to the mask pattern is removed through etching, to form a groove in the semiconductor structure. A conductive material is filled in the groove to form the capacitor plug.

For example, the semiconductor structure in this embodiment may be a DRAM. Certainly, this embodiment is not limited thereto, and the semiconductor structure in this embodiment may also be other structures.

In this embodiment, the semiconductor structure includes a substrate, a plurality of bit line structures arranged at intervals in parallel on the substrate, and a plurality of word line structures arranged at intervals in parallel on the substrate. The substrate is internally provided active areas and word line structures. The bit line structures are arranged on the substrate. The word line structures and the bit line structures intersect to define a plurality of grids arranged in an array on the substrate.

A material of the substrate may be, for example, monocrystalline silicon, polycrystalline silicon, amorphous silicon, silicon-germanium compound, silicon-on-insulator, and other materials known to those skilled in the art. The substrate is provided therein with active areas and word line structures. The active areas are arranged in an array. Isolation structures may be also arranged in the substrate, and the isolation structures are located in the peripheries of the active areas and are used to isolate adjacent active areas. The active area may be made of silicon. The isolation structure may be made of silicon oxide.

The word line structures may be buried word lines. The buried word lines intersect with the active areas and extend along a surface parallel to the substrate. The buried word lines may include a word line conductive layer and a gate electrode layer. The gate electrode layer is located in a region where the buried word line intersects with the active area, and the word line conductive layer is located in other regions of the buried word lines. The extension direction of the bit line structures may be perpendicular to that of the word line structures, that is, the plurality of grids defined by the word line structures and the bit line structures are rectangular. It needs to be noted that the extension direction of the active area and that of the bit line structure form an angle, such that projection of the bit line structure on the substrate can further intersect with the active area.

The capacitor plug is located in the grid. The projection of the capacitor plug on the substrate covers a part of the active area. The capacitor plug extends in a direction perpendicular to the surface of the substrate until the capacitor plug is connected to the active area, such that the capacitor structure is connected to the active area by using the capacitor plug, and data information is stored or read in the capacitor structure. The cross section of the capacitor plug is arcuate in a cross section parallel to the surface of the substrate, to increase a distance between the capacitor plug and the adjacent bit line structure, and reduce the parasitic capacitance generated between them, thereby preventing current leakage from occurring.

The mask plate structure provided by this embodiment includes a mask component. A mask pattern is provided on the mask component, and the mask component is used to cover a semiconductor structure, such that capacitor plugs are formed on the semiconductor structure by using the mask component. The capacitor plug is located in the grid defined by the word line structures and the bit line structures. The projection of the capacitor plug on the substrate covers a part of the active area. The cross section of the capacitor plug is arcuate in the cross section parallel to the surface of the substrate. When there is a distance between each of the capacitor plugs and each of the bit line structures, compared with a capacitor plug with a rectangular cross section, the contact area between the capacitor plug with an arcuate cross section and the active area is increased, which is beneficial to improving the performance of the semiconductor structure.

Figure 4:
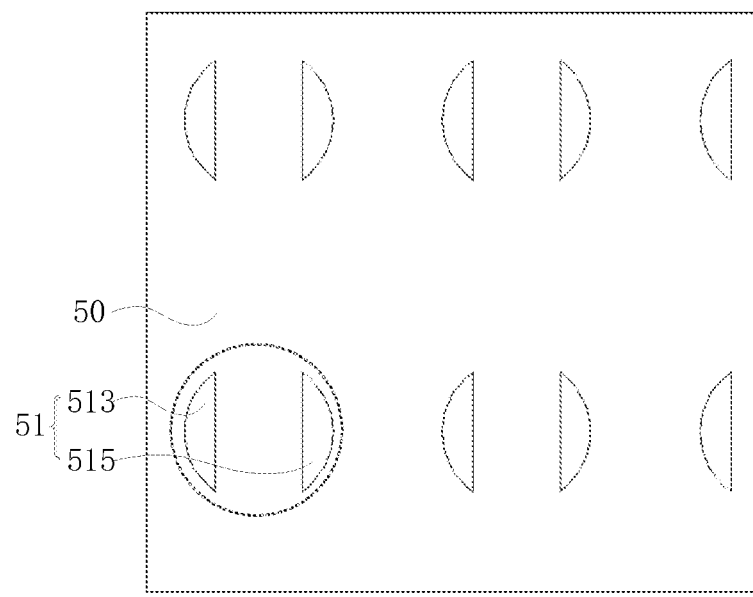
FIG. 4 is a schematic structural diagram 1 of a first mask plate according to an embodiment of the present application.
Figure 5:
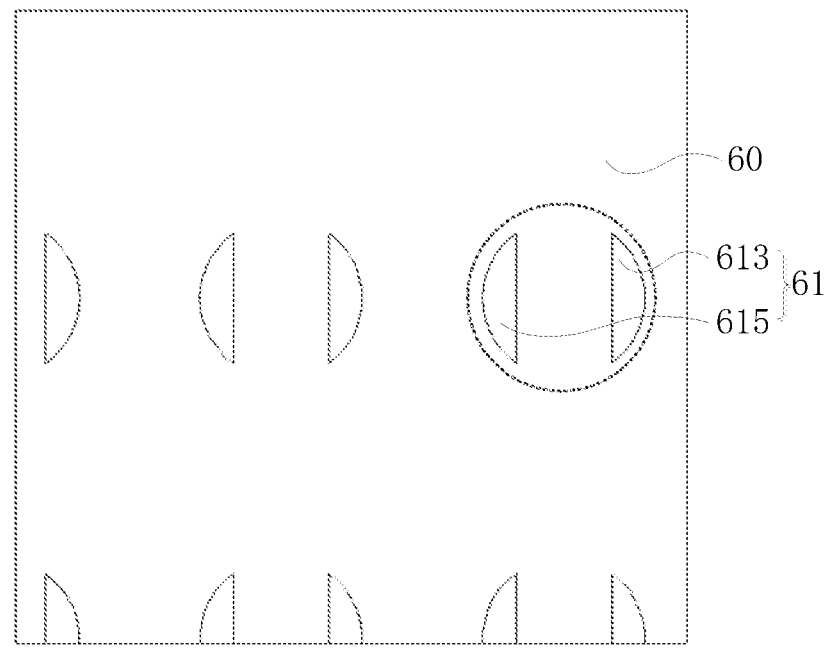
FIG. 5 is a schematic structural diagram 1 of a second mask plate according to an embodiment of the present application.

As shown in FIG. 4 and FIG. 5, in a possible implementation, the mask component may include a first mask plate 50 and a second mask plate 60. The mask pattern can be formed by stacking the first mask plate 50 and the second mask plate 60. The capacitor plug is formed by performing a double pattern process on the first mask plate 50 and the second mask plate 60, which is beneficial to improving the process precision, and ensure the operation performance of the semiconductor structure.

A plurality of first hole sets 51 arranged in an array are provided in the first mask plate 50, each of the first hole sets 51 includes a first etch hole 513 and a second etch hole 515 that are opposite to each other, the first etch hole 513 and the second etch hole 515 are both arcuate, and the first etch holes 513 and the second etch holes 515 are used to form the capacitor plugs on two sides of each of the bit line structures.

A plurality of second hole sets 61 arranged in an array are provided in the second mask plate 60, each of the second hole sets 61 includes a third etch hole 613 and a fourth etch hole 615 that are opposite to each other, the third etch hole 613 and the fourth etch hole 615 are both arcuate, and the third etch holes 613 and the fourth etch holes 615 are used to form the capacitor plugs on two sides of each of the bit line structures. Circle centers corresponding to the first etch hole 513 and the second etch hole 515 overlap, that is, the first hole set 51 is in the same circle. Similarly, circle centers corresponding to the third etch hole 613 and the fourth etch hole 615 also overlap, that is, the second hole set 61 is also located in a same circle.

Figure 6:
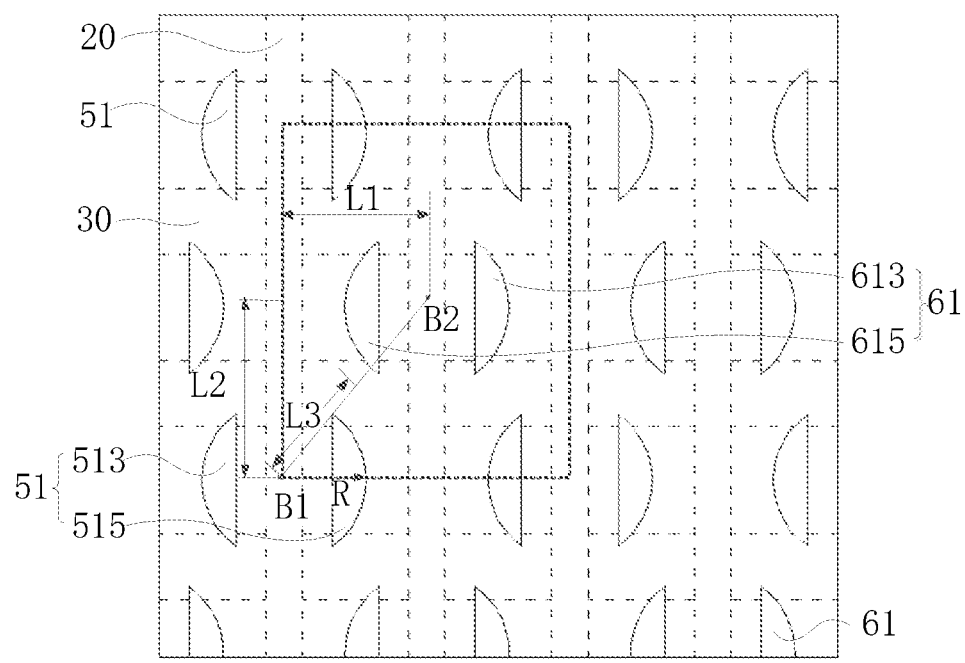
FIG. 6 is a schematic structural diagram 1 of a mask pattern formed by the first mask plate and the second mask plate according to an embodiment of the present application.

FIG. 6 is a schematic structural diagram of a mask pattern formed by the first mask plate and the second mask plate where the dotted lines are the projection of the word line structure and that of the bit line structure in the mask pattern.

With reference to FIG. 4 to FIG. 6, projection of the second hole set 61 on the substrate is located outside of the first hole set 51 on the substrate, such that the first hole set 51 and the second hole set 61 form the mask pattern, and capacitor plugs are formed based on the first hole set 51 and the second hole set 61.

In some embodiments, the projection of the first hole sets 51 and that of the second hole sets 61 on the substrate are arranged alternately. For example, because the first hole sets 51 are arranged in an array, circle centers corresponding to four adjacent first hole sets 51 can form a rectangle. When the first hole set 51 and the second hole set 61 overlap, the circle center corresponding to the second hole set 61 is located at the center of the rectangle, such that the first hole set 51 and the second hole set 61 can both cover the grids defined by the word line structures 30 and the bit line structures 20, thereby subsequently forming the capacitor plug.

In some embodiments, circle centers of corresponding arcs of the first etch hole 513, the second etch hole 515, the third etch hole 613, and the fourth etch hole 615 are all located on the center lines of the bit line structures 20. For example, the distance between the first etch hole 513 and a center line of the bit line structure 20 is the same as that between the second etch hole 515 and the center line of the bit line structure 20, that is, a distance between the first etch hole 513 and its adjacent bit line structure 20 is equal to that between the second etch hole 515 and its adjacent bit line structure 20. When the size of the capacitor plug is further decreased, the positions of circle centers of corresponding arcs of the first etch hole 513, the second etch hole 515, the third etch hole 613 and the fourth etch hole 615 are not changed, which is beneficial to further increase a distance between the capacitor plug and its adjacent bit line structure 20, thereby preventing current leakage from occurring. Similarly, a distance between the third etch hole 613 and a center line of the bit line structure 20 is the same as that between the fourth etch hole 615 and the center line of the bit line structure 20, which is beneficial to further increase a distance between the capacitor plug and its adjacent bit line structure 20, when the size of the capacitor plug is further decreased, thereby preventing current leakage from occurring.

In some embodiments, there is a first distance L1 between center lines of any two adjacent bit line structures 20 along a direction parallel to the surface of the substrate. There is a second distance L2 between center lines of any two adjacent word line structures 30 along a direction parallel to the surface of the substrate.

It needs to be noted that the projection of the capacitor plug on the substrate can cover a part of the active area. The capacitor plug of which its projection can cover a part of the active area is an efficient region, while the capacitor plug of which its projection cannot cover the active area is not an efficient region.

In some embodiments, radiuses R of corresponding arcs of the first etch hole 513, the second etch hole 515, the third etch hole 613, and the fourth etch hole 615 are greater than half the first distance L1, such that the capacitor plug has a sufficient efficient region, to ensure that the capacitor plug can be connected to the active area, which is beneficial to connect the capacitor structure to the active area by using the capacitor plug.

In some embodiments, the radiuses R of corresponding arcs of the first etch hole 513, the second etch hole 515, the third etch hole 613, and the fourth etch hole 615 are less than half the positive square root of the sum of squares of the first distance and the second distance. As shown in FIG. 5, a distance between a circle center B1 on one side of the word line structure 30 and a circle center B2 on the other side of the word line structure 30 is the positive square root of the sum of squares of the first distance L1 and the second distance L2. Half the positive square root of the sum of squares of the first distance L1 and the second distance L2 is a distance L3. The radiuses R are less than the distance L3, to prevent the capacitor plugs located on two sides of the word line structure 30 from overlapping due to the excessively large radiuses R.

In some embodiments, the secants of the first etch hole 513, the second etch hole 515, the third etch hole 613, and the fourth etch hole 615 are all parallel to the extension direction of the bit line structure 20, which is beneficial to prevent a distance between the capacitor plug and the bit line structure 20 from being decreased, thereby preventing current leakage from occurring.

In some embodiments, projection of the first etch hole 513, the second etch hole 515, the third etch hole 613, and the fourth etch hole 615 on the substrate covers a part of the word line structure 30, such that the capacitor plug has a sufficient efficient region, to ensure that the capacitor plug can be connected to the active area, which is beneficial to connect the capacitor structure to the active area by using the capacitor plug.

Figure 7:
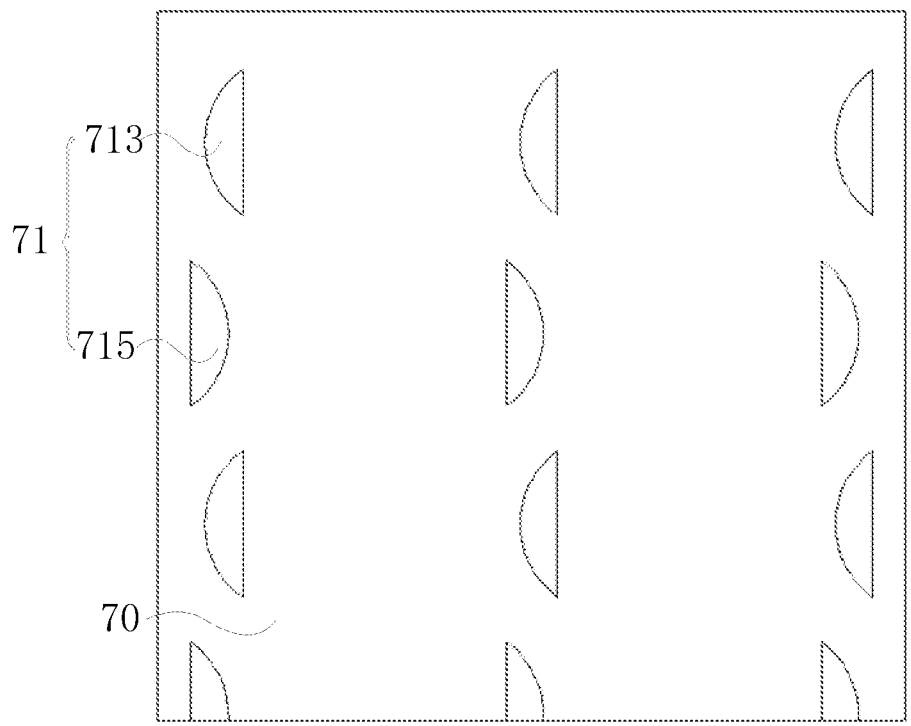
FIG. 7 is a schematic structural diagram 2 of the first mask plate according to an embodiment of the present application.
Figure 8:
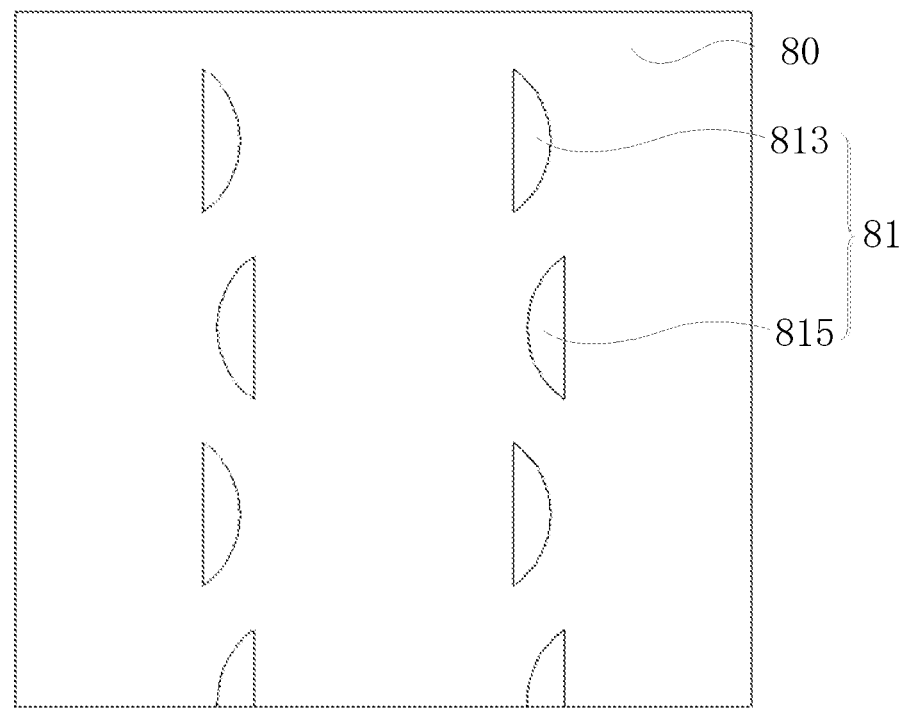
FIG. 8 is a schematic structural diagram 2 of the second mask plate according to an embodiment of the present application.

As shown in FIG. 7 and FIG. 8, in another possible implementation, the mask component may include a first mask plate 70 and a second mask plate 80, a plurality of first mask holes 71 arranged in an array are provided in the first mask plate 70, a plurality of second mask holes 81 arranged in an array are provided in the second mask plate 80, and the first mask holes 71 and the second mask holes 81 are all arcuate. The projection of the first mask hole 71 on the substrate is located at one side of the bit line structure, and projection of the corresponding second mask hole 81 on the substrate is located at the other side of the bit line structure. The mask pattern can be formed by stacking the first mask plate 70 and the second mask plate 80. The capacitor plug is formed by performing a double pattern process on the first mask plate 70 and the second mask plate 80, which is beneficial to improving the process precision, and ensure the operation performance of the semiconductor structure.

For example, the first mask hole 71 is provided therein with a first arcuate hole 713 and a second arcuate hole 715 arranged alternately. The first arcuate hole 713 has an arc and a secant connected to the arc. The second arcuate hole 715 also has an arc and a secant connected to the arc. If a distance between the arc of the first arcuate hole 713 and a bit line structure is smaller than that between the secant of the first arcuate hole 713 and the same bit line structure, the distance between the secant of the second arcuate hole 715 and the bit line structure is smaller than the arc of the second arcuate hole 715 and the bit line structure. As shown in the figure, the first row in the first mask holes 71 includes first arcuate holes 713, and the second row includes second arcuate holes 715. By analogy, the first arcuate holes 713 and the second arcuate holes 715 are arranged alternately.

Similarly, the second mask hole 81 is provided therein with a third arcuate hole 813 and a fourth arcuate hole 815 arranged alternately. The third arcuate hole 813 has an arc and a secant connected to the arc. The fourth arcuate hole 815 also has an arc and a secant connected to the arc. If a distance between the arc of the third arcuate hole 813 and a bit line structure is smaller than that between the secant of the third arcuate hole 813 and the same bit line structure, the distance between the secant of the fourth arcuate hole 815 and the bit line structure is smaller than the arc of the fourth arcuate hole 815 and the bit line structure. As shown in the figure, the first row in the second mask holes 81 includes third arcuate holes 813, and the second row includes fourth arcuate holes 815. By analogy, the third arcuate holes 813 and the fourth arcuate holes 815 are arranged alternately.

Figure 9:
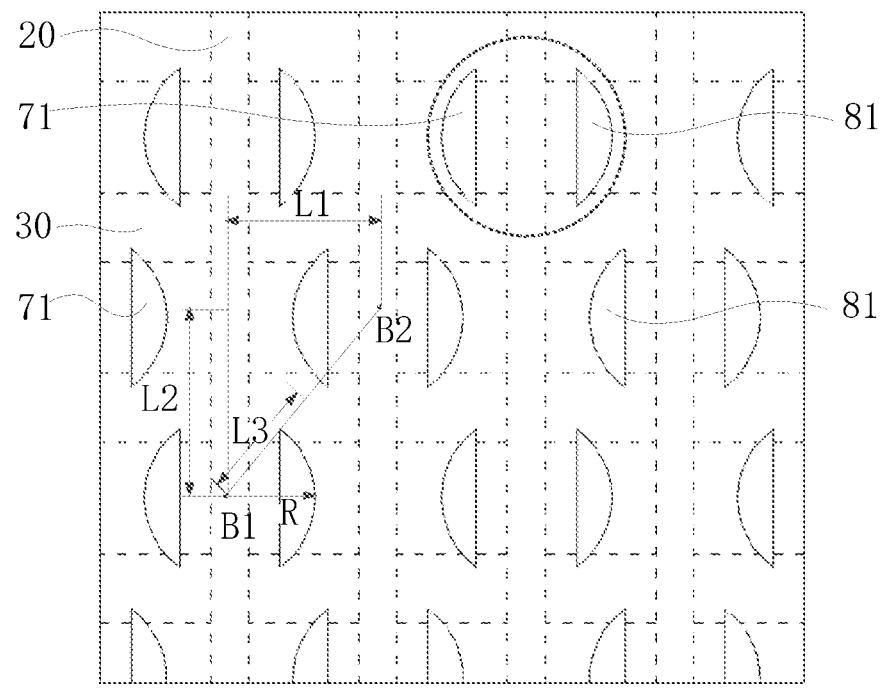
FIG. 9 is a schematic structural diagram 2 of the mask pattern formed by the first mask plate and the second mask plate according to an embodiment of the present application.

FIG. 9 is another schematic structural diagram of a mask pattern formed by the first mask plate and the second mask plate, where the dotted lines are the projection of the word line structure and that of the bit line structure in the mask pattern.

In some embodiments, circle centers of corresponding arcs of the first mask hole 71 and the corresponding second mask hole 81 overlap, that is, the first mask hole 71 and the corresponding second mask hole 81 are located in a same circle, which is beneficial to further increase a distance between the capacitor plug and its adjacent bit line structure 20, when the size of the capacitor plug is further decreased, thereby preventing current leakage from occurring.

In some embodiments, the circle centers of the corresponding arcs of the first mask holes 71 and the second mask holes 81 are located on the center lines of the bit line structures 20. For example, a distance between the first mask hole 71 and a center line of the bit line structure 20 is the same as that between the second mask hole 81 and the center line of the bit line structure 20, that is, a distance between the first mask hole 71 and its adjacent bit line structure 20 is equal to that between the second mask hole 81 and its adjacent bit line structure 20, which is beneficial to further increase a distance between the capacitor plug and its adjacent bit line structure, when the size of the capacitor plug is further decreased, thereby preventing current leakage from occurring.

In some embodiments, there is a first distance L1 between center lines of any two adjacent bit line structures 20 along a direction parallel to the surface of the substrate. There is a second distance L2 between center lines of any two adjacent word line structures 30 along a direction parallel to the surface of the substrate.

It needs to be noted that the projection of the capacitor plug on the substrate can cover a part of the active area. The capacitor plug of which its projection can cover a part of the active area is an efficient region, while the capacitor plug of which its projection cannot cover the active area is not an efficient region.

In some embodiments, radiuses R of corresponding arcs of the first mask hole 71 and the second mask hole 81 are greater than half the first distance L1, such that the capacitor plug has a sufficient efficient region, to ensure that the capacitor plug can be connected to the active area, which is beneficial to connect the capacitor structure to the active area by using the capacitor plug.

In some embodiments, the radiuses R of corresponding arcs of the first mask hole 71 and the second mask hole 81 are less than half the positive square root of the sum of squares of the first distance L1 and the second distance L2. As shown in FIG. 9, a distance between a circle center B1 on one side of the word line structure 30 and a circle center B2 on the other side of the word line structure 30 is the positive square root of the sum of squares of the first distance L1 and the second distance L2. Half the positive square root of the sum of squares of the first distance L1 and the second distance L2 is a distance L3. The radiuses R are less than the distance L3, to prevent the capacitor plugs located on two sides of the word line structure 30 from overlapping.

In some embodiments, the first mask hole 71 and the second mask hole 81 are both parallel to the extension direction of the bit line structure 20, and their secants are parallel to the extension direction of the bit line structure 20, which is beneficial to prevent a distance between the capacitor plug and the bit line structure 20 from being decreased, thereby preventing current leakage from occurring.

In some embodiments, the projection of the first mask hole 71 and that of the second mask hole 81 on the substrate cover a part of the word line structure 30, such that the formed capacitor plug has a sufficient efficient region, to ensure that the capacitor plug can be connected to the active area, which is beneficial to connect the capacitor structure to the active area by using the capacitor plug.

It should be noted that in an implementation different from the foregoing two implementations, an entire mask pattern may be further formed directly on the mask pattern in different processes.

For example, etch holes arranged in an array are provided in the mask plate, and are all arcuate. The etch holes may include two through holes arranged correspondingly, and are respectively used to form capacitor plugs located on two sides of the bit line structure. The two through holes are located in a same circle. The etch holes are also located on two sides of the word line structure and are used to form the capacitor plugs on two sides of the bit line structure. The capacitor plugs can be formed in the semiconductor structure by performing a transfer process once on the foregoing mask plates, which is beneficial to improving the production efficiency.

Those skilled in the art can clearly understand that, for convenience and conciseness of description, only the division of the foregoing function modules is used as an example. In practical applications, the foregoing functions may be allocated to and completed by different function modules as required, that is, an internal structure of the apparatus is divided into different function modules to complete all or some of the functions described above. For a specific working process of the apparatus described above, refer to the corresponding process in the foregoing method embodiment. Details are not described herein again.

Finally, it should be noted that the foregoing embodiments are merely used to explain the technical solutions of the present application, but are not intended to limit the present application. Although the present application is described in detail with reference to the foregoing embodiments, the person of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A semiconductor structure, comprising:
   a substrate, wherein the substrate is provided therein with active areas and word line structures, and the word line structures are arranged at intervals in parallel in the substrate;
   bit line structures, wherein the bit line structures are arranged at intervals in parallel on the substrate, the word line structures and the bit line structures intersect to define a plurality of grids arranged in an array on the substrate, and each of the grids comprises a first grid located at one side of one of the bit line structures and a second grid located at another side of the one of the bit line structures; and
   capacitor plugs, wherein each of the capacitor plugs comprises a first plug located in the first grid and a second plug located in the second grid, a projection of the each of the capacitor plugs on the substrate covers a part of one of the active areas, and cross sections of the capacitor plugs are arcuate in a cross section parallel to a surface of the substrate; in the cross section parallel to the surface of the substrate, a cross section of the first plug has a first arc, a cross section of the second plug has a second arc, the first arc and the second arc are in a same circle, and a circle center of the first arc and a circle center of the second arc are located on a center line of the one of the bit line structures;
   wherein there is a first distance between center lines of any two adjacent ones of the bit line structures along a direction parallel to the surface of the substrate, and there is a second distance between center lines of any two adjacent ones of the word line structures along the direction parallel to the surface of the substrate; and
   a radius of the first arc and a radius of the second arc are greater than half the first distance, and the radius of the first arc and the radius of the second arc are less than half a positive square root of a sum of squares of the first distance and the second distance.

2. The semiconductor structure according to claim 1, wherein the cross section of the first plug has a first secant, the cross section of the second plug has a second secant, and the first secant and the second secant are parallel to an extension direction of the bit line structures.

3. The semiconductor structure according to claim 2, wherein a projection of the first secant and a projection of the second secant on the substrate both cover a part of one of the word line structures.

4. A mask plate structure, comprising a mask component, wherein a mask pattern is provided on the mask component, and the mask component is used to cover a semiconductor structure, such that capacitor plugs are formed on the semiconductor structure by using the mask component;
   the semiconductor structure comprises a substrate and a plurality of word line structures arranged at intervals in parallel on the substrate, the substrate is provided therein with active areas and bit line structures, the bit line structures are arranged at intervals in parallel on the substrate, the word line structures and the bit line structures intersect to define a plurality of grids arranged in an array on the substrate;
   the capacitor plugs are located in the grids, a projection of each of the capacitor plugs on the substrate covers a part of one of the active areas, and cross sections of the capacitor plugs are arcuate in a cross section parallel to a surface of the substrate;
   the mask component comprises a first mask plate and a second mask plate, a plurality of first hole sets arranged in an array are provided in the first mask plate, each of the first hole sets comprises a first etch hole and a second etch hole that are opposite to each other, the first etch hole and the second etch hole are both arcuate, and the first etch hole and the second etch hole are used to form one of the capacitor plugs on two sides of one of the bit line structures;
   a plurality of second hole sets arranged in an array are provided in the second mask plate, each of the second hole sets comprises a third etch hole and a fourth etch hole that are opposite to each other, the third etch hole and the fourth etch hole are both arcuate, and the third etch hole and the fourth etch hole are used to form one of the capacitor plugs on two sides of the one of the bit line structures;
   projections of the second hole sets on the substrate are located outside projections of the first hole sets on the substrate, and the projections of the first hole sets and the projections of the second hole sets on the substrate are arranged alternately;
   a circle center of a corresponding arc of the first etch hole, a circle center of a corresponding arc of the second etch hole, a circle center of a corresponding arc of the third etch hole, and a circle center of a corresponding arc of the fourth etch hole are all located on center lines of the bit line structures;
   there is a first distance between center lines of any two adjacent ones of the bit line structures along a direction parallel to the surface of the substrate, and there is a second distance between center lines of any two adjacent ones of the word line structures along the direction parallel to the surface of the substrate; and
   a radius of the corresponding arc of the first etch hole, a radius of the corresponding arc of the second etch hole, a radius of the corresponding arc of the third etch hole, and a radius of the corresponding arc of the fourth etch hole are greater than half the first distance; the radius of the corresponding arc of the first etch hole, the radius of the corresponding arc of the second etch hole, the radius of the corresponding arc of the third etch hole, and the radius of the corresponding arc of the fourth etch hole are less than half a positive square root of a sum of squares of the first distance and the second distance; a secant of the first etch hole, a secant of the second etch hole, a secant of the third etch hole, and a secant of the fourth etch hole are all parallel to an extension direction of the bit line structures; and a projection of the first etch hole, a projection of the second etch hole, a projection of the third etch hole, and a projection of the fourth etch hole on the substrate all cover parts of the word line structures.

5. A mask plate structure, comprising a mask component, wherein a mask pattern is provided on the mask component, and the mask component is used to cover a semiconductor structure, such that capacitor plugs are formed on the semiconductor structure by using the mask component;

the semiconductor structure comprises a substrate and a plurality of word line structures arranged at intervals in parallel on the substrate, the substrate is provided therein with active areas and bit line structures, the bit line structures are arranged at intervals in parallel on the substrate, the word line structures and the bit line structures intersect to define a plurality of grids arranged in an array on the substrate;

the capacitor plugs are located in the grids, a projection of each of the capacitor plugs on the substrate covers a part of one of the active areas, and cross sections of the capacitor plugs are arcuate in a cross section parallel to a surface of the substrate;

the mask component comprises a first mask plate and a second mask plate, a plurality of first mask holes arranged in an array are provided in the first mask plate, a plurality of second mask holes arranged in an array are provided in the second mask plate, and the first mask holes and the second mask holes are all arcuate;

a projection of one of the first mask holes on the substrate is located at one side of one of the bit line structures, and a projection of a corresponding one of the second mask holes on the substrate is located at another side of the one of the bit line structures;

a circle center of a corresponding arc of one of the first mask holes overlaps with a circle center of a corresponding arc of the corresponding one of the second mask holes, and the circle center of the corresponding arc of the one of the first mask holes and the circle center of the corresponding arc of the corresponding one of the second mask holes are located on a center line of the one of the bit line structures;

there is a first distance between center lines of any two adjacent ones of the bit line structures along a direction parallel to the surface of the substrate, and there is a second distance between center lines of any two adjacent ones of the word line structures along the direction parallel to the surface of the substrate; and radiuses of corresponding arcs of the first mask holes and radiuses of corresponding arcs of the second mask holes are greater than half the first distance, the radiuses of the corresponding arcs of the first mask holes and the radiuses of the corresponding arcs of the second mask holes are less than half a positive square root of a sum of squares of the first distance and the second distance, secants of the first mask holes and secants of the second mask holes are all parallel to an extension direction of the bit line structures, and projections of the first mask holes and projections of the second mask holes on the substrate both cover parts of the word line structures.

* * * * *